United States Patent [19]

Yates

[11] Patent Number: 5,050,534
[45] Date of Patent: Sep. 24, 1991

[54] MOBILE INJECTOR SYSTEM

[75] Inventor: Cleon R. Yates, Austin, Tex.

[73] Assignee: Cryco Twenty-Two, Inc., Austin, Tex.

[21] Appl. No.: 388,919

[22] Filed: Aug. 3, 1989

[51] Int. Cl.⁵ .................................... C23C 16/00
[52] U.S. Cl. ............................... 118/733; 118/715
[58] Field of Search ............ 118/715, 725, 728, 500, 118/733

[56] References Cited

U.S. PATENT DOCUMENTS

| | | | |
|---|---|---|---|
| 4,466,381 | 8/1984 | Jenkins | 118/728 |
| 4,751,895 | 6/1988 | Yates | 118/728 |
| 4,793,283 | 12/1988 | Sarkozy | 118/725 |
| 4,911,638 | 3/1990 | Bayne | 118/725 |

Primary Examiner—Richard Bueker
Attorney, Agent, or Firm—Hugh D. Jaeger

[57] ABSTRACT

A mobile injector system with a CVD door assembly including flexible tubing secured to the door, a hole for accommodating a SiC or like paddle, and an injector clamp securing the injector tubes to the paddle. The CVD door assembly mates to a gas ring. A gas inlet channel extends through the CVD door assembly to communicate with the flexible tubing and with the injector tubes. The gas ring secures to a back ring and over and about an annular flange on the end of a process tube. Gas inlet channels extend through the gas ring to connect to gas inlet couplings to communicate with gas inlet ports in the CVD door. The injector tubes are in a predetermined geometrical proximity to the paddle, and provide for repeatability of processes for the semiconductor wafers or substrates.

4 Claims, 9 Drawing Sheets

MOBILE INJECTOR SYSTEM

BACKGROUND OF THE INVENTION

1. Field of the Invention

The present invention pertains to processing systems for semiconductor substrates, such as silicon wafers, and more particularly, pertains to a mobile injector system utilizing a CVD door assembly and a gas ring assembly. Also, the present invention includes structure of a CVD door with gas inlet channels for passing gas to injectors which are clamped in geometrical proximity to a paddle, such as a silicon carbide (SiC) paddle.

2. Description of the Prior Art

In the prior art processes, the injector tubes have usually been positioned in the bottom of the process tube. A representative prior art patent is U.S. Pat. No. 4,466,381 issued on Aug. 21, 1984. Reference is made to FIGS. 5 and 6 showing manifolds positioned below a wafer boat.

In the prior art processes, the manifolds or injector tubes are well below the boats or quartz wafer carriers and do not inject the processing gasses in close proximity to the substrates, such as silicon wafers being processed. Further, the manifolds or injector tubes can be moved during cleaning of the process tube, and therefore, the conditions for processing are not repeatable, as there are variables such as the position of the manifolds or injector tubes with respect to the substrates or silicon wafers being processed.

The present invention overcomes the disadvantages of the prior art by providing a mobile injector system including a CVD door with gas inlet channels, gas inlet ports for mating with injectors, an injector clamp for securing between a paddle and the injectors, and a gas ring and back ring secured about the end of a process tube for mating with the CVD door.

SUMMARY OF THE INVENTION

The present invention provides a mobile injector system including a gas ring assembly with gas inlet couplings for mating with gas inlets in a CVD door. The CVD door assembly includes piping structure for piping gas through the door to the injector tubes and a clamp for securing the injector tubes in a predetermined geometrical proximity to a paddle extending through the CVD door. The placement of the injector tubes with respect to the paddle provides for repeatability of processing of substrates, such as silicon wafers.

According to embodiments of the present invention, there is provided a mobile injector system comprising a CVD door, including a gas inlet port, gas inlet channel, and a flexible tubing secured to the CVD door including swage lock fittings. A paddle extends through the door supported by a suitable structure, such as a door closure apparatus for encapsulating a wafer paddle, U.S. Pat. No. 4,751,895, issued to the same assignee as this patent, and an injector clamp supporting injectors with respect to the paddle. A corresponding gas ring assembly, including a gas ring and a back ring, secure about the end flange on a quartz process tube and includes a gas inlet for communicating with the gas inlet port of the CVD door.

Significant aspects and features of the present invention include a CVD door with a gas inlet channel for communicating gas from a gas ring to injector tubes.

Another significant aspect and feature of the present invention is an injector clamp which clamps one or more injector tubes to predetermined geometrical locations about a paddle, providing for repeatability of wafer processes.

A further significant aspect and feature of the present invention is a gas ring, including a gas inlet for communicating gas to a gas inlet port of a CVD door.

Another significant aspect and feature of the present invention is the use of flexible tubing members between the CVD door and the injector tubes.

Having thus described embodiments of the present invention, it is a principal object hereof to provide a mobile injector system.

One object of the present invention is to provide a mobile injector system for repeatability of wafer processes, minimizing any processing variables, such as the position of the injectors with respect to the paddle and the wafer boats or wafer carriers.

Another object of the present invention is to provide an injector clamp to clamp one or more injectors in a predetermined position with respect to a wafer processing paddle.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
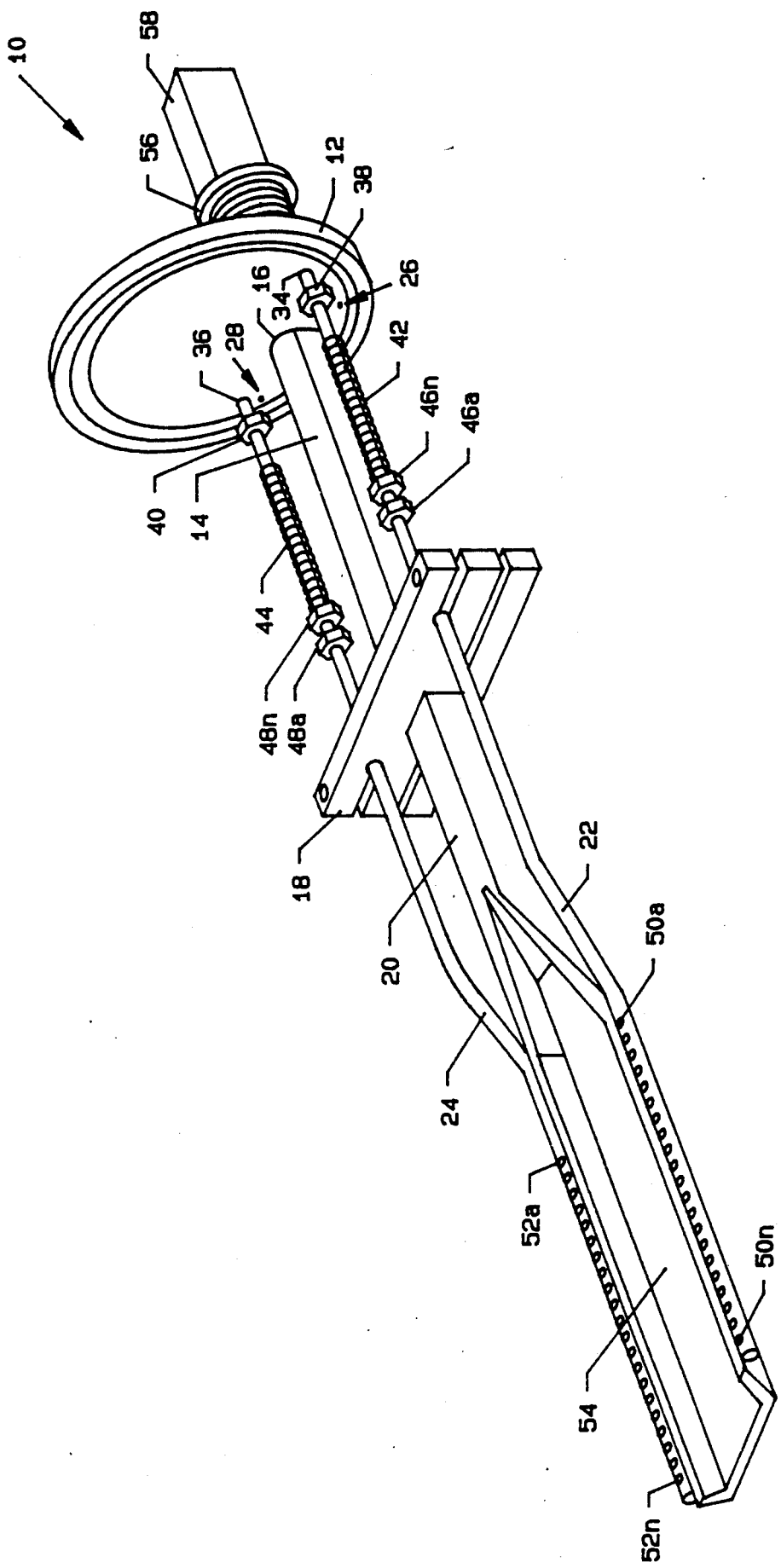
FIG. 1 illustrates a perspective view of the CVD door assembly.

FIG. 1 illustrates a perspective view of a controlled vapor deposition (CVD) door assembly 10 which includes a CVD door 12 that mates to components of a quartz process tube as later described in detail, a silicon paddle 14 extending through an orifice 16 in the CVD door 12, an injector clamp 18 secured over and about the shaft portion 20 of the silicon paddle 14, and holed injector tubes 22 and 24 secured in the injector clamp 18. Gas inlet ports 26 and 28 are connected by gas inlet channels 30 and 32 in the CVD door 12, as illustrated and described in FIGS. 3 and 4, to stainless steel tubing members 34 and 36 extending at right angles from the CVD door 12. Swage lock fittings 38 and 40 on the stainless steel tubing members 34 and 36 connect the stainless steel tubing members 34 and 36 to flexible tubing members 42 and 44. The flexible tubing members 42 and 44 connect to the holed injector tubes 22 and 24, respectively, through a plurality of tube fittings 46a-46n. A continuous passage exists between the gas inlet ports 26 and 28 and the plurality of holes 50a-50n and 52a-52n in the holed injector tubes 22 and 24, respectively, via the gas inlet ports 26 and 28, gas inlet channels 30 and 32, stainless steel tubing members 34 and 36, swage lock fittings 38 and 40, flexible tube members 42 and 44, and tube fittings 46a-46n and 48a-48n. The holed injector tubes 22 and 24 conform to a predetermined portion 54 of the silicon paddle 14. The injector can be placed at any location on, around or about the paddle that an operator deems most beneficial to obtain process results. The silicon paddle 14, the injector clamp 18, the holed injector tubes 22 and 24 and tube fittings 46a-46n and 48a-48n travel horizontally with respect to the CVD door 12 while at the same time compressing or expanding the flexible tube members 42 and 44 depending on the direction of movement. A door closure bellows assembly 56, as patented by the applicant in U.S. Pat. No. 4,751,895, is positioned about the shaft portion 20 to seal against the CVD door 12, and is secured to a paddle clamp assembly 58. As the paddle clamp assembly 58, the door closure bellows assembly 56, the silicon paddle 14, and the CVD door 12 are positioned against, about and into a gas ring on a quartz process tube, as described later in detail, the flexible tube members 42 and 44 are allowed to flex after sealing of the CVD door 12 as the silicon paddle 14 continues travel further inwardly to the desired position for processing.

Figure 2:
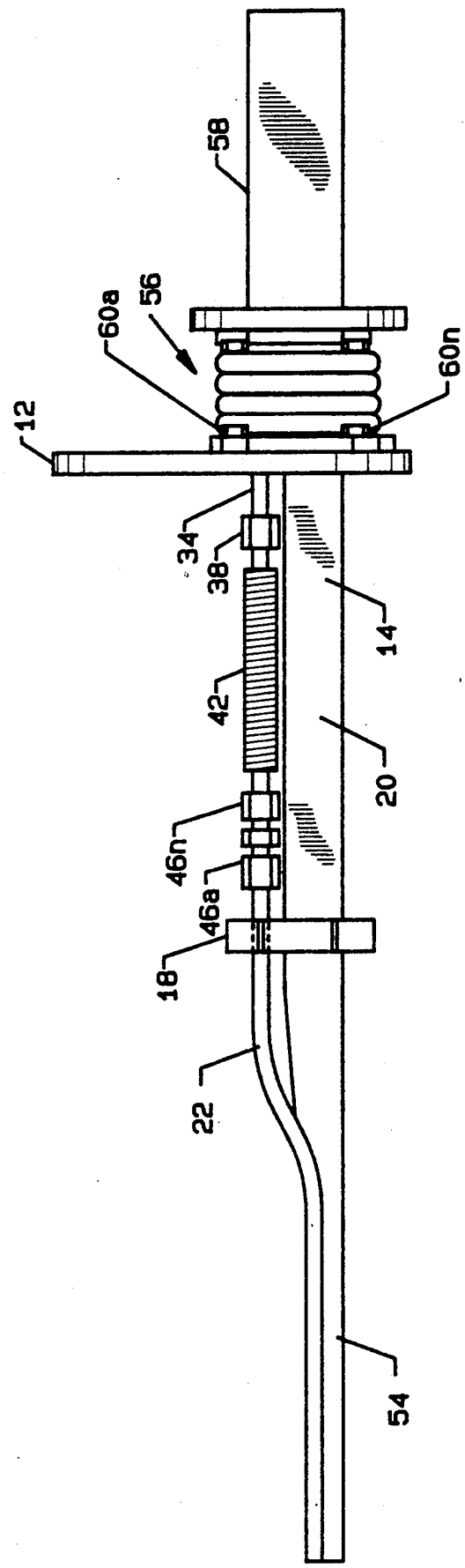
FIG. 2 illustrates a side view of the CVD door assembly.

FIG. 2 illustrates a side view of the CVD door assembly 10 where all numerals correspond to those elements previously described. Illustrated in particular is the paddle clamp assembly 58 and the door closure bellows assembly 56 secured to the CVD door 12 by a plurality of fasteners 60a-60n.

Figure 3:
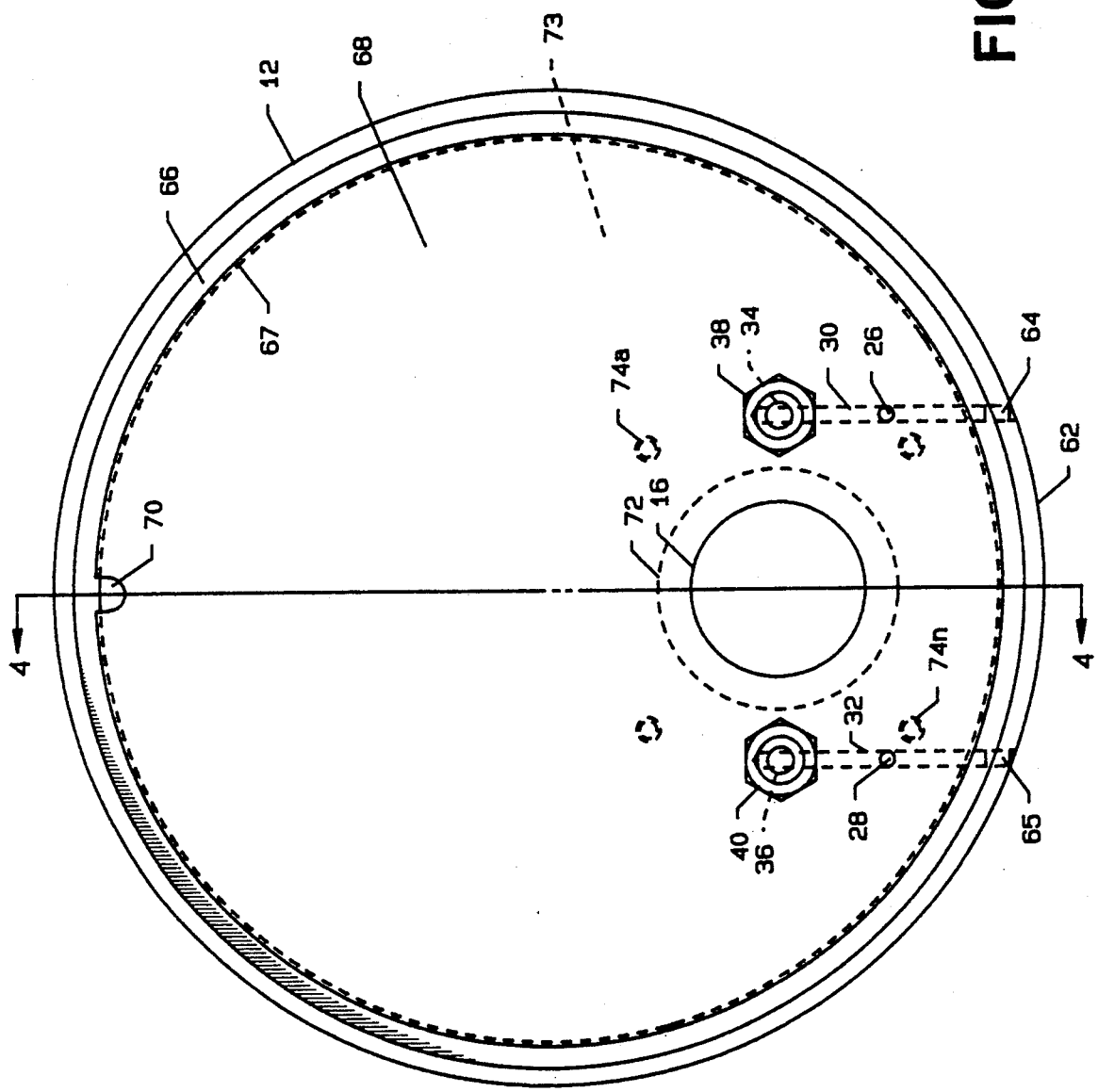
FIG. 3 illustrates a front view of the CVD door.

FIG. 3 illustrates an end view of the CVD door 12 where all numerals correspond to those elements previously described. Gas inlet chambers 30 and 32 are drilled vertically to the circumferential edge 62 of the CVD door 12 and include plugs 64 and 65. An annular O-ring groove 66 is located near the circumferential edge 62 on the inner face 68 of the CVD door 12 and also includes an O-ring removal slot 70. An annular recess 72 aligns concentrically on the back face 73 to accommodate the door closure bellows assembly 56 of FIG. 1. A plurality of bottomed holes 74a-74n, also on the back face 73, accommodate fasteners 60a-60n which secure the door closure bellows assembly 56 to the CVD door 12.

Figure 4:
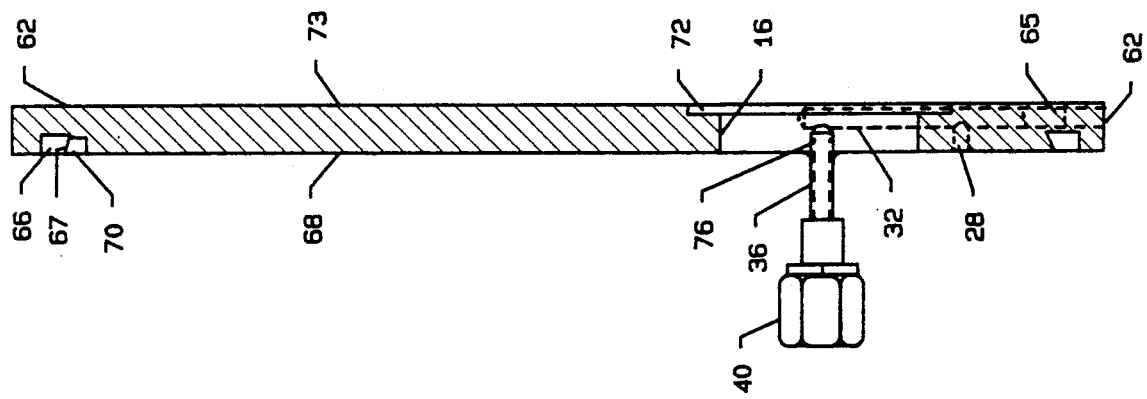
FIG. 4 illustrates a side view in partial cross section of the CVD door.

FIG. 4 illustrates a cross-sectional view of the CVD door 12 taken along line 4—4 of FIG. 3 where all numerals correspond to those elements previously described. The stainless steel tubing member 36 secures in hole 76 by welding and is connected to the gas inlet channel 32. The stainless steel tubing member 34 secures in a similar fashion.

Figure 5:
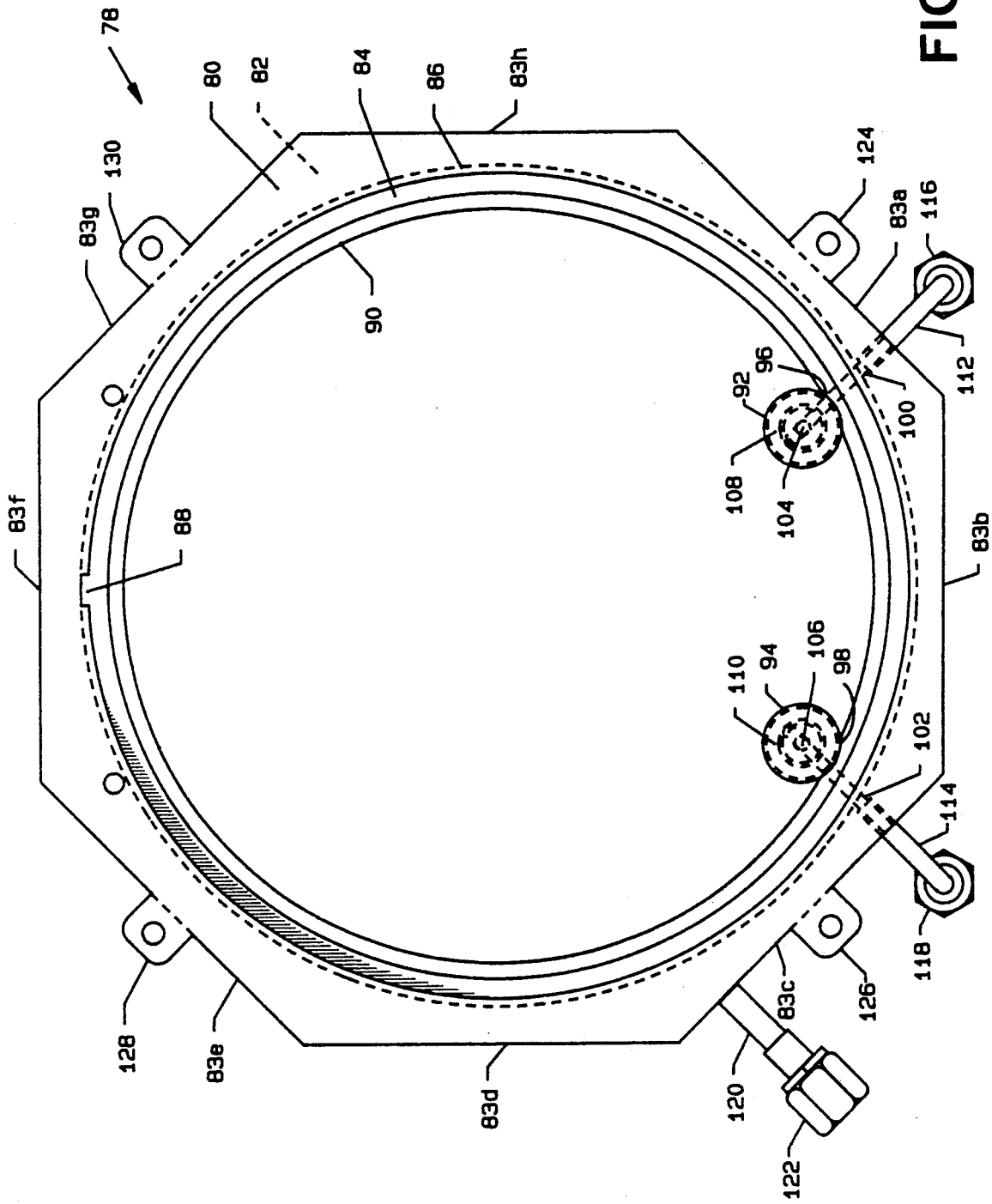
FIG. 5 illustrates a front view of the gas ring.
Figure 9:
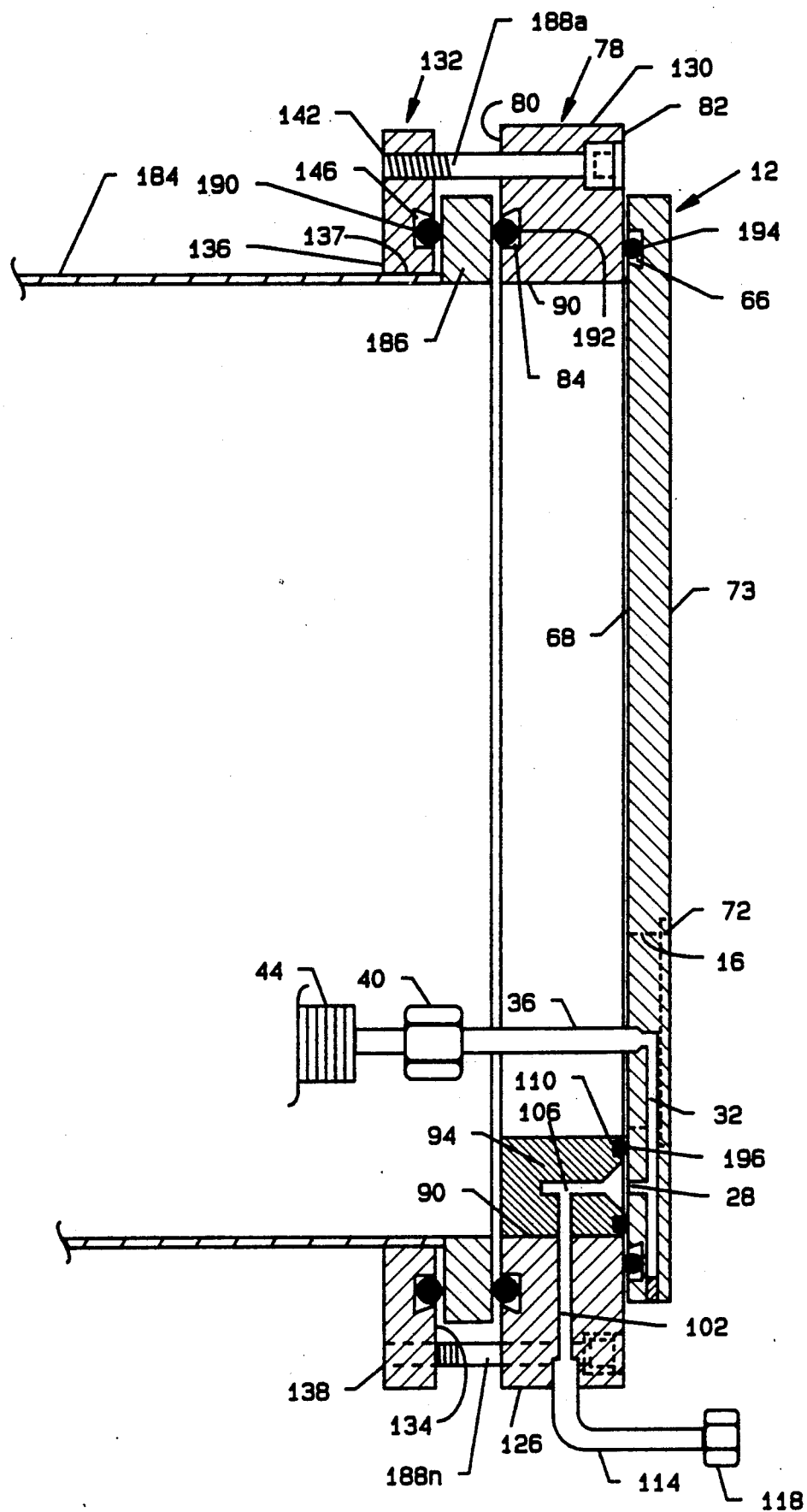
FIG. 9 illustrates a CVD door assembly in cross section engaged against the gas ring assembly.

FIG. 5 illustrates an end view of a gas ring 78, the outer portion of which is octagonal in shape including a front face 80, a back face 82, flat surfaces 83a-83h, an O-ring groove 84 recessed into the front face 80, an angled O-ring groove surface 86, an O-ring removal slot 88, an inner circumferential surface 90, and gas inlet couplings 92 and 94 secured in arcular surfaces 96 and 98. The gas couplings include dual radius inlet channels 100 and 102 drilled through the gas ring flat surfaces 83a and 83c, respectively, and into the gas inlet couplings 92 and 94 to intersect with horizontally aligned dual radius inlet channels 104 and 106. A plurality of (or at least one) O-ring grooves 108 and 110 are located on the operator side of the gas inlet couplings 92 and 94. Stainless steel tubes 112 and 114, including couplings 116 and 118, align in the dual radius inlet channels 100 and 102. The gas inlet couplings 92 and 94 align and seal over and about the gas inlet ports 26 and 28 of the CVD door 12 illustrated in FIG. 3. FIG. 9 illustrates this alignment in detail. A stainless steel tube 120 with a coupling 122 align perpendicularly in the flat surface 83c and vents internally to an area along and about the inner circumferential surface 90 to provide for additional input of gases. Holed mounting flanges 124, 126, 128 and 130 are located on flat surfaces 83a, 83c, 83e and 83g.

Figure 6:
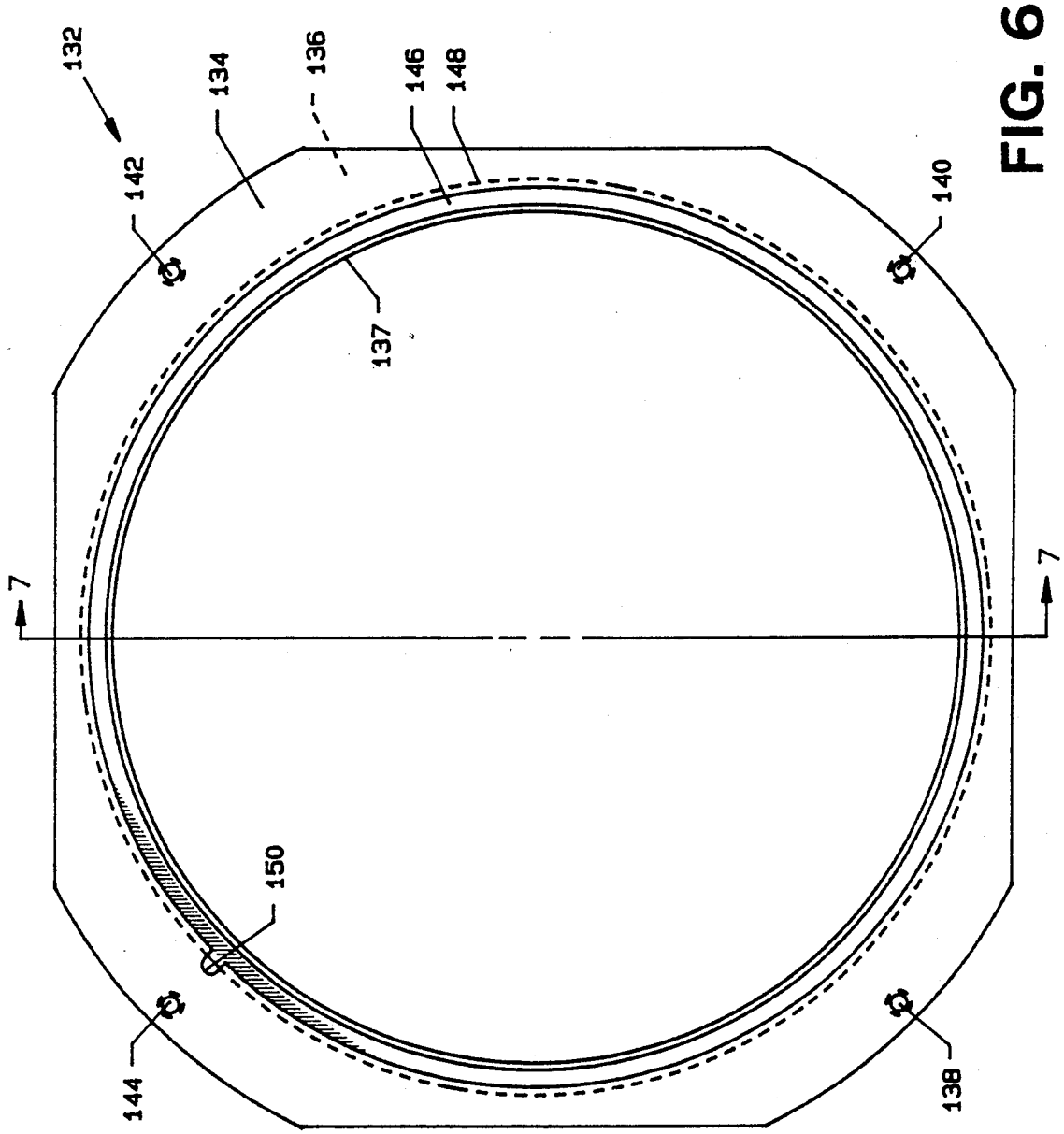
FIG. 6 illustrates a front view of the back ring.

FIG. 6 illustrates an end view of the back ring 132 with rounded corner having a front face 134, a back face 136, inner circumferential surface 137, and holes 138, 140, 142 and 144 adjacent to the rounded corners which align respectively with holed mounting flanges 124, 126, 128 and 130. An O-ring groove 146 is recessed into the front face 134 and includes an angled O-ring groove surface 148 and an O-ring removal slot 150.

Figure 7:
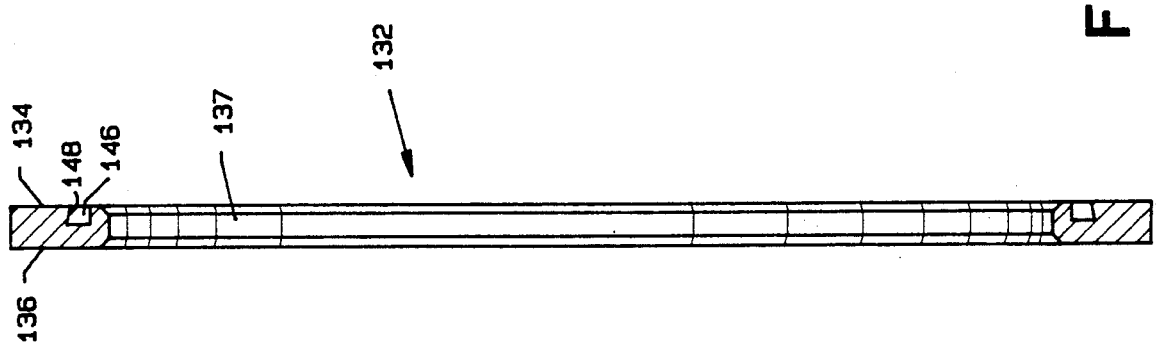
FIG. 7 illustrates a side view in cross section of the gas ring.

FIG. 7 illustrates a cross-sectional view of the back ring 132 taken along line 7—7 of FIG. 6 where all numerals correspond to those elements previously described.

Figure 8:
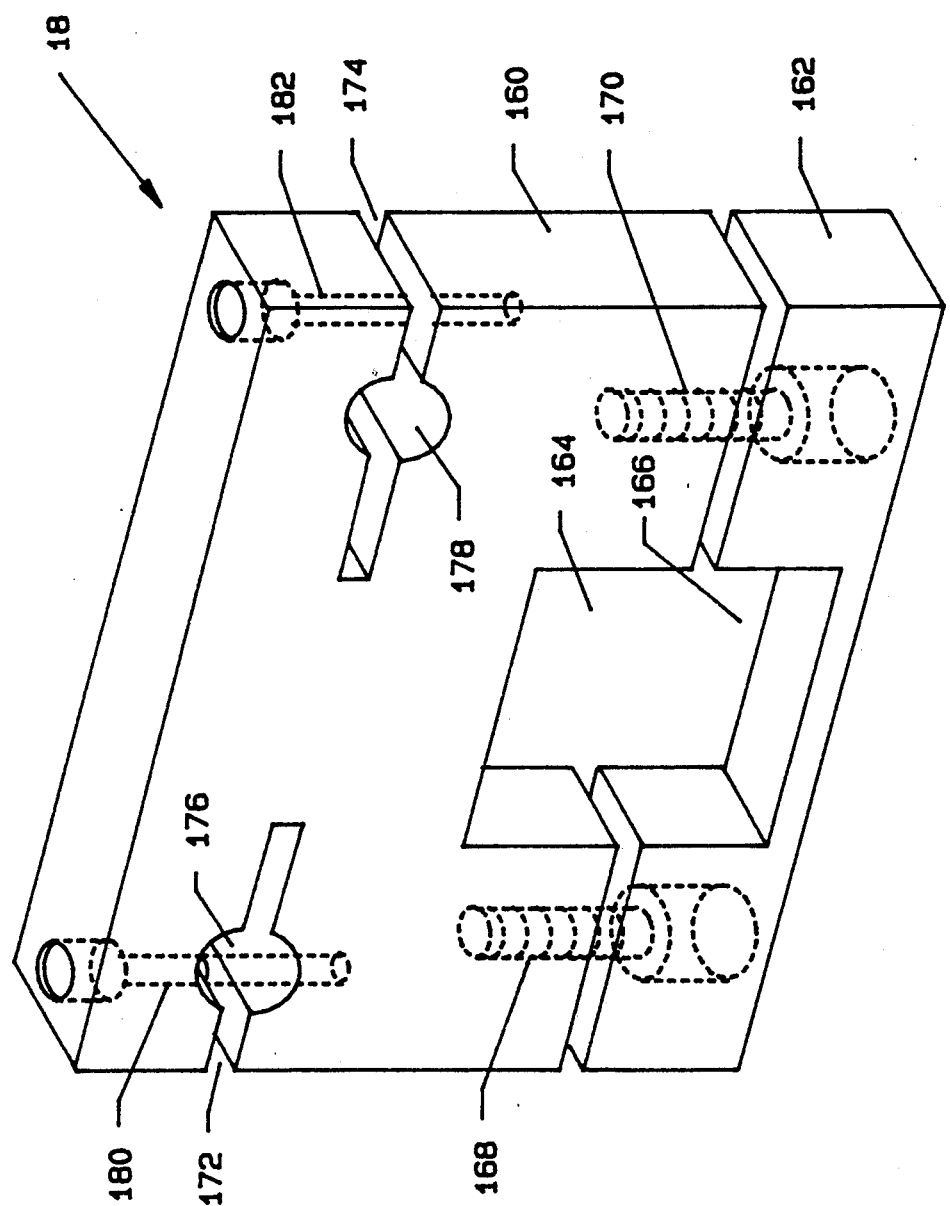
FIG. 8 illustrates a perspective view of the clamp.

FIG. 8 illustrates a perspective view of the injector clamp 18 including top and bottom U-shaped members 160 and 162. The U-shaped top member 160 includes a rectangular like cutout 164, and the U-shaped bottom member 162 includes a rectangular like cutout 166, each of which fit over and about the silicon paddle 14 as illustrated in FIG. 1. Fasteners 168 and 170 extend through the U-shaped bottom member 162 into the U-shaped top member 160 to draw the U-shaped bottom member 162 to the U-shaped top member 160. The U-shaped top member 160 includes horizontally aligned slots 172 and 174. Horizontally aligned clamp holes 176 and 178 are located midway along and through the upper and lower surfaces of the slots 172 and 174. Fasteners 180 and 182 extend through the top surface of the U-shaped top member 160 and through the respective slots 172 and 174 and into the central area of the U-shaped top member 160 to effect tightened clamping holes 176 and 178 which secure the holed injector tubes 22 and 24 as illustrated in FIG. 1.

MODE OF OPERATION

FIG. 9 illustrates a cross-sectional view of the gas ring 78 of the CVD door assembly 10 mated to a process tube 184 where all numerals correspond to those elements previously described. The quartz process tube 184 includes an annular ring 186 secured to the end of the quartz process tube 184. The gas ring 78 and the back ring 132 are secured over and about the annular ring 186 by a plurality of fasteners 188a-188n through the holed flanges 126 and 130, as illustrated, as well as holed flanges 124 and 128. The fasteners 188a-188n continue through to the back ring holes 138 and 142, as illustrated, as well as holes 140 and 144. An O-ring 190 in the back ring O-ring groove 146 and an O-ring 192 in the O-ring groove 84 seal against the annular ring 186. An O-ring 194 in the O-ring groove 66 in the CVD door 12 seals the CVD door 12 to the back face 82 of the gas ring 78 when the CVD door 12 is positioned for processing. Another seal is also effected at this time where an O-ring seal 196 residing in the O-ring groove 110 in the gas inlet coupling 94 seals over the gas inlet port 28 and ultimately connecting the stainless steel tube 114 to the flexible tube member 44 through the inlet channels 102 and 106, gas inlet port 28, the gas inlet channel 32, the stainless steel tubing member 36 and the swage lock fitting 40. Another seal is similarly effected between the stainless steel tube 112 of FIG. 5 and the flexible tube member 42 via the gas inlet port 26 illustrated in FIG. 1.

Various modifications can be made to the present invention without departing from the apparent scope hereof.

I claim:

1. Gas ring assembly for engaging about an end of a process tube for semiconductor processes, comprising:
   a. gas ring for engaging against and between a front end flange of a process tube and a CVD door, the gas ring including gas inlet means for engaging with a gas inlet channel of a CVD door;
   b. back ring for engaging against a back end flange of a process tube; and,
   c. means securing said gas ring to said back ring.

2. Gas ring assembly of claim 1 including O-ring means between said gas ring and said flange.

3. Gas ring assembly of claim 1 including O-ring means between said back ring and said flange.

4. In combination, a CVD door assembly and a gas ring assembly, said combination comprising:
   a. a CVD door assembly including a paddle hole, and at least one gas inlet port extending through said door; and,
   b. a gas ring assembly for engaging against and between a front end flange of a process tube and a CVD door, the gas ring including gas inlet means for engaging with a gas inlet channel of a CVD door, back ring for engaging against a back end flange of a process tube, and means securing said gas ring to said back ring.

* * * * *